United States Patent
Wei

(10) Patent No.: US 11,429,137 B2
(45) Date of Patent: Aug. 30, 2022

(54) TIME SYNCHRONIZATION DEVICE, ELECTRONIC APPARATUS, TIME SYNCHRONIZATION SYSTEM AND TIME SYNCHRONIZATION METHOD

(71) Applicant: BOE TECHNOLOGY GROUP CO., LTD., Beijing (CN)

(72) Inventor: Xiangye Wei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 185 days.

(21) Appl. No.: 16/620,547

(22) PCT Filed: Apr. 16, 2019

(86) PCT No.: PCT/CN2019/082926
§ 371 (c)(1),
(2) Date: Dec. 9, 2019

(87) PCT Pub. No.: WO2019/237825
PCT Pub. Date: Dec. 19, 2019

(65) Prior Publication Data
US 2021/0356985 A1 Nov. 18, 2021

(30) Foreign Application Priority Data
Jun. 11, 2018 (CN) .......................... 201810596413.9

(51) Int. Cl.
G06F 1/12 (2006.01)
H03K 5/01 (2006.01)
H04L 7/033 (2006.01)

(52) U.S. Cl.
CPC ................ *G06F 1/12* (2013.01); *H03K 5/01* (2013.01); *H04L 7/0331* (2013.01)

(58) Field of Classification Search
None
See application file for complete search history.

(56) References Cited

U.S. PATENT DOCUMENTS

| 5,778,073 A | 7/1998 | Busching et al. |
| 6,751,743 B1 | 6/2004 | Theodoras, II et al. |

(Continued)

FOREIGN PATENT DOCUMENTS

| CN | 101013934 | 8/2007 |
| CN | 101039145 | 9/2007 |

(Continued)

OTHER PUBLICATIONS

Chinese Office Action dated Apr. 17, 2020 corresponding to Chinese Patent Application No. 201810596413.9; 25 pages.

(Continued)

*Primary Examiner* — Cassandra F Cox
(74) *Attorney, Agent, or Firm* — Leason Ellis LLP

(57) ABSTRACT

A time synchronization device adapted for an electronic apparatus, an electronic apparatus, a time synchronization system and a time synchronization method. The time synchronization device includes: a signal generating circuit and a time adjusting circuit. The signal generating circuit includes: a control circuit, configured to generate a frequency control word; and a signal adjusting circuit, configured to receive the frequency control word and an input signal having an initial frequency, and to generate and output an output signal having a target frequency based on the frequency control word and the input signal. The time adjusting circuit is configured to perform a synchronization adjusting operation on a clock signal of the electronic apparatus based on the output signal having the target frequency.

20 Claims, 7 Drawing Sheets

(56) References Cited

U.S. PATENT DOCUMENTS

| | | |
|---|---|---|
| 9,582,028 B1 | 2/2017 | Xiu |
| 10,571,953 B2 * | 2/2020 | Fayneh .................... G06F 1/06 |
| 2002/0125959 A1 | 9/2002 | Atsumi et al. |
| 2007/0018743 A1 | 1/2007 | Sheng et al. |
| 2007/0176691 A1 | 8/2007 | Batchelor et al. |
| 2013/0077642 A1 | 3/2013 | Webb, III et al. |

FOREIGN PATENT DOCUMENTS

| | | |
|---|---|---|
| CN | 106027187 | 10/2016 |
| CN | 106936425 | 7/2017 |
| CN | 107425851 | 12/2017 |
| EP | 1753055 | 2/2007 |
| JP | 2000323987 A | 11/2000 |
| KR | 20140022986 A | 2/2014 |
| RU | 2118059 | 8/1998 |
| WO | 03098363 | 11/2003 |
| WO | 2005109547 | 11/2005 |
| WO | 2008077102 | 6/2008 |
| WO | 2010088155 | 8/2010 |

OTHER PUBLICATIONS

Korean Office Action and English translation, corresponding to Korean Patent Application No. 10-2020-7018704, dated Jul. 30, 2021. 10 pages.
Russian Office Action dated Dec. 28, 2020 corresponding to Russian Patent Application No. 2020121188; 13 pages.
Extended European Search Report issued by the European Patent Office for the corresponding European Patent Application No. 19819039.9, dated Feb. 1, 2022. 10 pages.

\* cited by examiner

TIME SYNCHRONIZATION DEVICE, ELECTRONIC APPARATUS, TIME SYNCHRONIZATION SYSTEM AND TIME SYNCHRONIZATION METHOD

CROSS-REFERENCE TO RELATED APPLICATIONS

This application is a U.S. National Stage Application under 35 U.S.C. § 371 of International Patent Application No. PCT/CN2019/082926, filed Apr. 16, 2019, which claims priority to Chinese Patent Application No. 201810596413.9 filed on Jun. 11, 2018, both of which are incorporated herein by reference in their entireties as part of the present application.

TECHNICAL FIELD

Embodiments of the present disclosure relate to a time synchronization device, an electronic apparatus, a time synchronization system and a time synchronization method.

BACKGROUND

In a distributed network information era, in order to make all apparatuses in a network system work in harmony and transmit information correctly, in many industries, such as "flash sale on the hour" and "leader election" of the information technology (IT) industry, "opening and closing the stock market" of the financial industry, "synchronous networking" of the communication industry, and other business processing, clock synchronization of all apparatuses in the network system is very important. A key to a network clock synchronization technology is frequencies of local clocks of individual apparatuses. The larger the frequency of a clock, the higher the precision of time synchronized from the network to a local apparatus, and the better the coordination and consistency between apparatuses.

SUMMARY

At least one embodiment of the present disclosure provides a time synchronization device adapted for an electronic apparatus, the time synchronization device comprising: a signal generating circuit and a time adjusting circuit, wherein the signal generating circuit comprises:
  a control circuit, configured to generate a frequency control word; and
  a signal adjusting circuit, configured to receive the frequency control word and an input signal having an initial frequency, and to generate and output an output signal having a target frequency based on the frequency control word and the input signal, and
the time adjusting circuit is configured to perform a synchronization adjusting operation on a clock signal of the electronic apparatus based on the output signal having the target frequency.

For example, in the time synchronization device according to at least one embodiment of the present disclosure, the control circuit is configured to generate the frequency control word based on an influence parameter of crystal oscillator drift.

For example, in the time synchronization device according to at least one embodiment of the present disclosure, the signal generating circuit further comprises a parameter acquiring circuit, and the parameter acquiring circuit is configured to acquire the influence parameter.

For example, in the time synchronization device according to at least one embodiment of the present disclosure, the influence parameter of the crystal oscillator drift comprises a temperature parameter;
  the parameter acquiring circuit comprises a temperature detecting sub-circuit; and
  the temperature detecting sub-circuit is configured to detect the temperature parameter.

For example, in the time synchronization device according to at least one embodiment of the present disclosure, the temperature detecting sub-circuit comprises a temperature detector and a first counter,
  the temperature detector is configured to detect an ambient temperature, wherein the temperature parameter comprises the ambient temperature; and
  the first counter is configured to record a frequency change amount based on the ambient temperature and a reference temperature.

For example, in the time synchronization device according to at least one embodiment of the present disclosure, the control circuit is configured to generate the frequency control word based on the ambient temperature according to a below equation:

$$F_N = \frac{F_{TO} \cdot f_\Delta + \Delta f \cdot F_{TO}^2}{f_\Delta}$$

where $F_N$ denotes the frequency control word; $F_{TO}$ denotes a reference frequency control word corresponding to the reference temperature; and $f_\Delta$ denotes a frequency of a reference time unit; and $$\Delta f = r \cdot \Delta T^n + p \cdot \Delta T^{n-1} + \ldots + d \cdot \Delta T + g$$

where $\Delta f$ denotes the frequency change amount; r, p, d and g are constants; $\Delta T$ denotes a difference between the ambient temperature and the reference temperature, $\Delta T = T1 - T2$; $T1$ denotes the ambient temperature; $T2$ denotes the reference temperature; and n is a positive integer.

For example, in the time synchronization device according to at least one embodiment of the present disclosure, the influence parameter of the crystal oscillator drift comprises an aging parameter;
the parameter acquiring circuit comprises an aging read sub-circuit; and
the aging read sub-circuit is configured to read the aging parameter of a crystal oscillator source.

For example, in the time synchronization device according to at least one embodiment of the present disclosure, the aging read sub-circuit comprises an aging read element and a second counter;
  the aging read element is configured to read an aging rate of the crystal oscillator source, and to read reference time corresponding to the aging rate; wherein the aging parameter comprises the aging rate and the reference time; and
  the second counter is configured to record an amount of the reference time.

For example, in the time synchronization device according to at least one embodiment of the present disclosure, the control circuit is configured to generate the frequency control word based on the aging rate according to a below equation:

$$F_N = F_{AO} \cdot (1+\gamma)$$

where $F_N$ denotes the frequency control word; $F_{AO}$ denotes the reference frequency control word; $\gamma$ denotes a product of the aging parameter, wherein γ=v·t, v denotes the aging rate, t denotes the amount of the reference time, and t is a natural number.

For example, in the time synchronization device according to at least one embodiment of the present disclosure, the signal adjusting circuit comprises a reference time unit generating sub-circuit and a frequency adjusting sub-circuit, the reference time unit generating sub-circuit is configured to receive the input signal having the initial frequency, and to generate and output the reference time unit based on the initial frequency; and the frequency adjusting sub-circuit is configured to generate and output the output signal having the target frequency based on the frequency control word and the reference time unit.

For example, in the time synchronization device according to at least one embodiment of the present disclosure, the reference time unit generating sub-circuit comprises:

a voltage controlled oscillator, configured to oscillate at a predetermined oscillation frequency;

a first phase locked loop circuit, configured to lock an output frequency of the voltage controlled oscillator to a reference output frequency; and K output terminals, configured to output K output signals having phases evenly spaced, K being a positive integer greater than 1, wherein the reference output frequency is denoted as $f_d$, the reference time unit is a time span between any two adjacent output signals output by the K output terminals, the reference time unit is denoted as $\Delta$, and $\Delta=1/(K \cdot f_d)$.

For example, in the time synchronization device according to at least one embodiment of the present disclosure, the reference time unit generating sub-circuit comprises: a voltage controlled delayer, a second phase locked loop circuit and K output terminals, the voltage controlled delayer comprises one or more cascaded delay units, and is configured to generate a delay signal based on the output signal of the second phase locked loop circuit and the input signal;

the second phase locked loop circuit is configured to lock an output frequency of the voltage controlled delayer to the reference output frequency based on the input signal and the delay signal;

the K output terminals are configured to output K output signals having phases evenly spaced, K is a positive integer greater than 1; and the reference output frequency is denoted as $f_d$, the reference time unit is a time span between any two adjacent output signals output by the K output terminals, the reference time unit is denoted as $\Delta$, and $\Delta=1/(K \cdot f_d)$.

For example, in the time synchronization device according to at least one embodiment of the present disclosure, the frequency adjusting sub-circuit is configured to determine the target frequency based on the frequency control word and the reference time unit according to a below equation:

$$f_{TAF-DPS}=1/(F \cdot \Delta)=(K \cdot f_d)/F$$

where $f_{TAF-DPS}$ denotes the target frequency, and F denotes the frequency control word.

For example, in the time synchronization device according to at least one embodiment of the present disclosure, the frequency adjusting sub-circuit comprises a time-average-frequency direct period synthesizer.

At least one embodiment of the present disclosure further provides an electronic apparatus, comprising any of the above-mentioned time synchronization devices.

For example, the electronic apparatus according to at least one embodiment of the present disclosure further comprises a frequency source, wherein the frequency source is configured to provide the input signal having the initial frequency.

At least one embodiment of the present disclosure further provides a time synchronization system, comprising: a plurality of electronic apparatuses, wherein at least one of the plurality of electronic apparatuses is any one of the above-mentioned electronic apparatus.

At least one embodiment of the present disclosure further provides a time synchronization method, adapted for any one of the above-mentioned time synchronization device, the time synchronization method comprising:

generating the frequency control word;

generating and outputting the output signal having the target frequency based on the frequency control word and the input signal; and performing the synchronization adjusting operation on the clock signal of the electronic apparatus based on the output signal having the target frequency.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, detailed descriptions of known functions and known components are omitted in the present disclosure.

Figure 1:
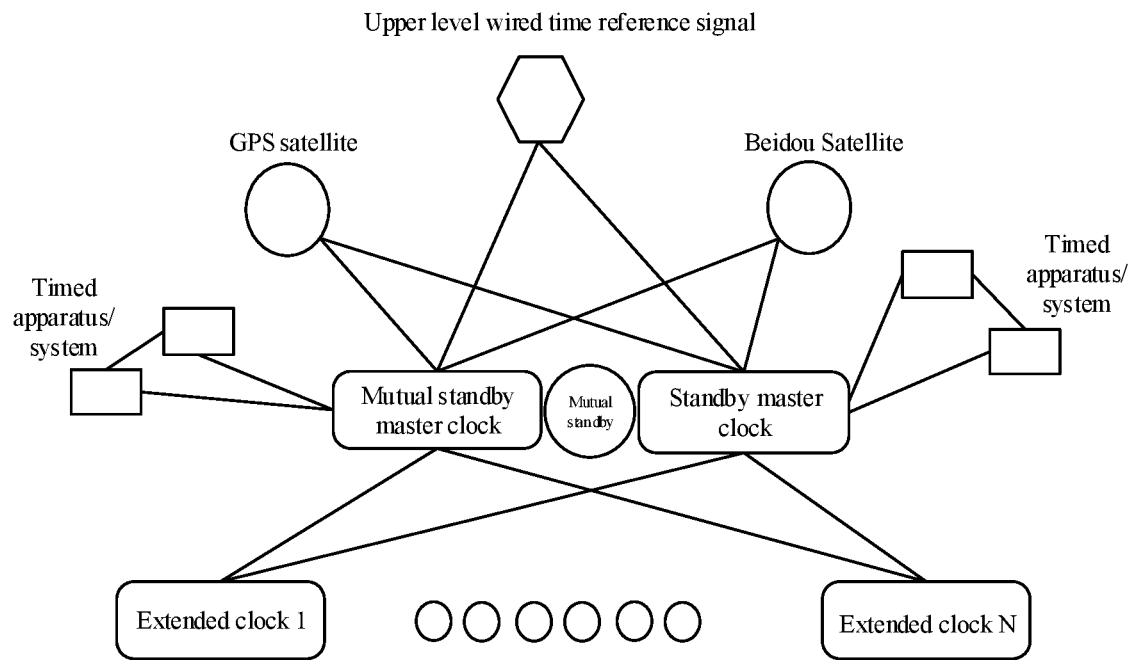
FIG. 1 is a schematic distribution diagram of a clock network.

FIG. 1 is a schematic distribution diagram of a clock network. As shown in FIG. 1, when facing a big data network (e.g., the Internet), it is necessary to drive all network nodes by a plurality of clock links, so that clocks of all the network nodes are synchronized. There are many ways to synchronize clocks, such as a pure software method, a pure hardware method, and a method of a combination of hardware and software. Specifically, the clock synchronization method includes one-way timing, two-way timing, a network clock synchronization technology, and clock correction through network messages (e.g., NTP and PTP technologies). One-way timing and two-way timing have relatively low precision, and the network clock synchronization technology and clock correction through network messages have precision higher than that of one-way timing and two-way timing. The clock synchronization method further includes a frequency synchronization method, for example, directly transmitting a standard frequency such as 10 MHz and 5 MHz with a cable or an optical cable (but the method has numerous limiting factors), obtaining a time difference between a master clock and a slave clock by measurement and implementing frequency locking by locking the time difference between the master clock and the slave clock, or indirectly calculating frequency deviation to complete frequency correction, and so on. However, in all of the above-described clock synchronization methods, a correction range of time precision is limited, and there are also differences between a server and a client in factors such as hardware, software and network links. Therefore, a change in each factor will have an influence on time correction of individual apparatuses in the network.

At least one embodiment of the present disclosure provides a time synchronization device used in an electronic apparatus, an electronic apparatus, a time synchronization system and a time synchronization method. The time synchronization device can synthesize an output signal with a sufficiently large frequency through a signal generating circuit, and the output signal has relatively high frequency granularity, so that the electronic apparatus obtains a more precise synchronous clock, which renders operation coordination and consistency of the electronic apparatus in the network system better.

Hereinafter, the embodiments of the present disclosure will be described in detail in conjunction with the accompanying drawings, but the present disclosure is not limited to these specific embodiments.

Figure 2:
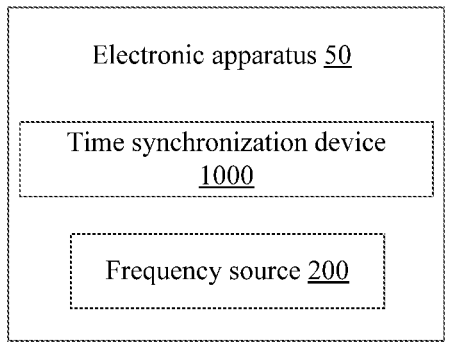
FIG. 2 is a schematic block diagram of an electronic apparatus provided by at least one embodiment of the present disclosure.
Figure 3:
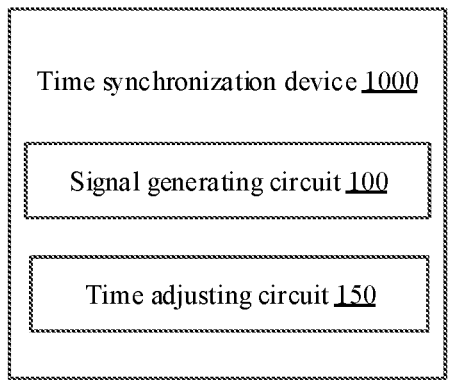
FIG. 3 is a schematic block diagram of a time synchronization device used in an electronic apparatus provided by at least one embodiment of the present disclosure.
Figure 4:
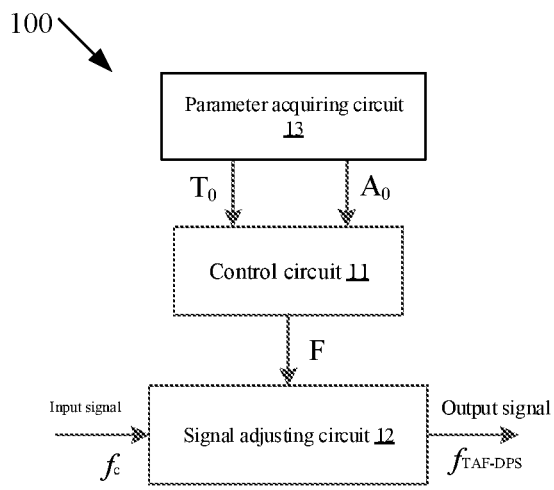
FIG. 4 is a schematic block diagram of a signal generating circuit provided by at least one embodiment of the present disclosure.
Figure 5:
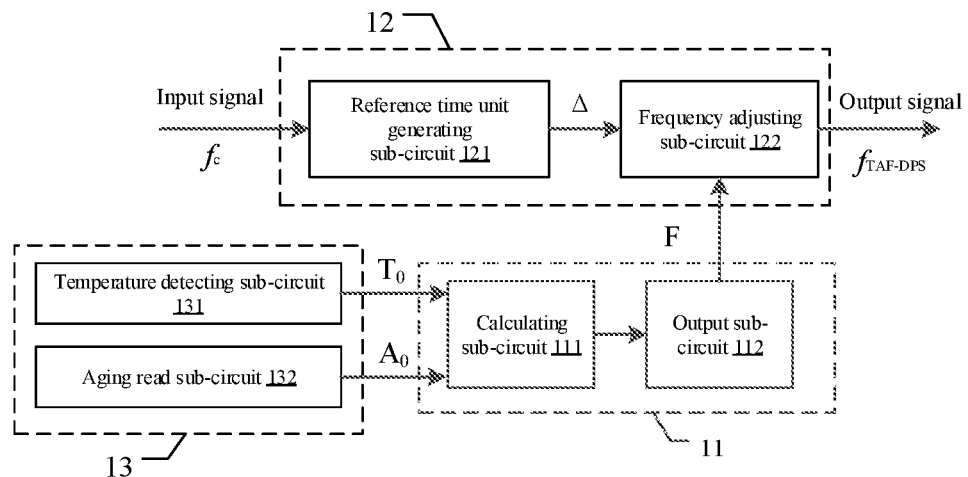
FIG. 5 is another schematic block diagram of a signal generating circuit provided by at least one embodiment of the present disclosure.

FIG. 2 is a schematic block diagram of an electronic apparatus provided by at least one embodiment of the present disclosure; FIG. 3 is a schematic block diagram of a time synchronization device used in an electronic apparatus provided by at least one embodiment of the present disclosure; FIG. 4 is a schematic block diagram of a signal generating circuit provided by at least one embodiment of the present disclosure; and FIG. 5 is another schematic block diagram of a signal generating circuit provided by at least one embodiment of the present disclosure.

For example, as shown in FIG. 2, an electronic apparatus 50 provided by at least one embodiment of the present disclosure may comprise a time synchronization device 1000 provided by at least one embodiment of the present disclosure. The electronic apparatus 50 may be, for example, any apparatus having a data transmission function, including but not limited to, a smart phone, a tablet personal computer, an e-book reader, a laptop portable computer, a desktop computer, and the like, which will not be limited in the embodiments of the present disclosure.

For example, as shown in FIG. 3, the time synchronization device 1000 provided by at least one embodiment of the present disclosure comprises a signal generating circuit 100 and a time adjusting circuit 150. As shown in FIG. 4, the signal generating circuit 100 includes a control circuit 11 and a signal adjusting circuit 12. The control circuit 11 is configured to generate a frequency control word. The signal adjusting circuit 12 is configured to receive an input signal having an initial frequency and the frequency control word, and generate and output an output signal having a target frequency based on the frequency control word and the input signal. For example, the time adjusting circuit 150 is configured to adjust a clock signal of the electronic apparatus based on the output signal having the target frequency, to obtain a synchronous clock signal.

For example, as shown in FIG. 2, the electronic apparatus 50 may further comprise a frequency source 200. The frequency source 200 is configured to provide the input signal having the initial frequency, and transmit the input signal to the signal generating circuit 100. For example, the initial frequency may represent a frequency of a signal actually generated and output by the frequency source 200. The target frequency represents a frequency of a signal that a user expects to obtain. For example, the target frequency represents a frequency which a signal output by the signal generating circuit 100 can reach. For example, the target frequency is larger than the initial frequency. The target frequency is related with time synchronization precision of a terminal apparatus that requires clock synchronization.

For example, a network clock synchronization system includes a first terminal apparatus and a second terminal apparatus, and the first terminal apparatus and the second terminal apparatus require to be synchronized. If a frequency of a local clock signal of the first terminal apparatus is f, then frequency precision that the first terminal apparatus can adjust is 1/f. A time error required to be corrected between the first terminal apparatus and the second terminal apparatus is t, if t>1/f, then the first terminal apparatus may better correct the time error between the first terminal apparatus and the second terminal apparatus, to better implement time synchronization between the first terminal apparatus and the second terminal apparatus. The corrected time error is $t_0=N_0/f$, where $N_0$ is an integer, $N_0$ may denote an integer closest to a result of dividing t by 1/f (i.e., t×f), and a synchronous time correction capability of the first terminal apparatus may be expressed as: $\delta=t-t_0=t-N_0/f$, where $\delta$ may denote the time error between the first terminal apparatus and the second terminal apparatus after correcting time of the first terminal apparatus. The larger f is, the closer $N_0$ is to t×f, and the smaller the time error $\delta$ is. However, if the time error to be corrected is t<1/f, then it is very difficult to complete correction of the time error by the first terminal apparatus, or, there is still a relatively large error between the corrected time obtained after correcting time of the first terminal apparatus and time of the second terminal apparatus. In summary, if a time error of a terminal apparatus to be corrected is t, then the target frequency $f_{TAF-DPS}$ may have a range that: $f_{TAF-DPS}>1/t$.

For example, the frequency source 200 may include a self-oscillating source and a synthesized frequency source. The self-oscillating source includes a crystal oscillator, a cavity oscillator, a voltage controlled oscillator, and so on. The synthesized frequency source includes a direct analog frequency source, a direct digital frequency source, an indirect analog frequency source and an indirect digital frequency source.

For example, the frequency source 200 may include a crystal oscillator source such as an ordinary crystal oscillator (XO), a temperature compensated crystal oscillator (TCXO) and an oven controlled crystal oscillator (OCXO).

For example, the clock synchronization technology may include synchronous time detection, remote clock estimation and local clock calibration. A formula of synchronous time precision of an electronic apparatus may be expressed as:

$$\pi = C_1 \cdot \varepsilon + C_2 \cdot G1 + C_3 \cdot G_2 + C_4 \cdot u + C_5 \cdot Gs$$

where $\pi$ denotes the synchronous time precision; $\varepsilon$ denotes transmission delay uncertainty in reading a remote clock; G1 denotes clock drift (i.e., frequency drift of the crystal oscillator source); G2 denotes read clock granularity, u denotes an adjustment granularity ratio; and Gs denotes clock setting granularity. $C_1$, $C_2$, $C_3$, $C_4$ and $C_5$ denote weighting factors. G2, u and Gs are all directly or indirectly related with the initial frequency $f_c$ of the input signal generated by the frequency source. A counter of the clock of the electronic apparatus increases as a step size ($1/f_c$) of the initial frequency $f_c$ of the input signal increase, so the higher the initial frequency $f_c$, the higher the synchronous time precision $\pi$ (the smaller the value of $\pi$, the higher the synchronous time precision).

For example, from the above-described formula of the synchronous time precision, it can be known that, the frequency drift of the crystal oscillator source has an influence on the synchronous time precision, and the frequency drift of the crystal oscillator source is usually caused by an ambient operating temperature and device aging. Therefore, it is necessary to compensate for the influence of the frequency drift of the crystal oscillator source on the target frequency of the output signal, so as to improve the synchronous time precision. The frequency control word may be used to control the target frequency of the output signal, whereby the frequency control word may be changed according to the frequency drift of the crystal oscillator source, so as to implement compensation to the target frequency of the output signal.

For example, the control circuit 11 is configured to acquire an influence parameter of crystal oscillator drift and generate a frequency control word based on the influence parameter. That is to say, the frequency control word may vary according to the influence parameter of the crystal oscillator drift. When the influence parameter of the crystal oscillator drift changes, the frequency control word changes accordingly.

For example, both the input signal and the output signal are pulse signals.

For example, the frequency control word is used to control the target frequency of the output signal. The signal adjusting circuit 12 may generate the output signal based on the frequency control word and the initial frequency of the input signal, and make a frequency of the generated output signal to be the target frequency, so as to satisfy requirements of time synchronization precision of different apparatuses. For example, with respect to the same initial frequency, if the frequency control word changes, the target frequency also changes accordingly, so that input signals with a same initial frequency may be converted into output signals with different target frequencies to satisfy requirements of different electronic apparatuses.

For example, as shown in FIG. 4, the signal generating circuit 100 further includes a parameter acquiring circuit 13. The parameter acquiring circuit 13 is configured to detect the influence parameter of the crystal oscillator drift, so as to compensate for the influence on the target frequency of the output signal due to the influence parameter of the crystal oscillator drift.

For example, due to the influence parameter of the crystal oscillator drift, the initial frequency of the input signal generated by the frequency source varies in different conditions. For example, factors that influence the crystal oscillator drift may include an ambient temperature and aging of the frequency source, etc. For example, in some examples, a frequency error of the initial frequency may reach ±10 ppm due to an influence of the ambient temperature. As influenced by aging of the frequency source, the frequency error of the initial frequency of the input signal generated by the frequency source increases and gradually accumulates over time. In the embodiment of the present disclosure, by detecting the influence parameter of the crystal oscillator drift, and based on the influence parameter of the crystal oscillator drift, the frequency control word is generated, and then the signal adjusting circuit 12 may generate the compensated output signal based on the frequency control word.

That is to say, the target frequency of the output signal is closer to or even equal to a frequency preset by the user, so as to compensate for the error of the target frequency of the output signal caused by the influence parameter of the crystal oscillator drift. Therefore, the signal generating circuit 100 provided by at least one embodiment of the present disclosure may implement frequency compensation to the output signal, correct the frequency error of the output signal, and improve time synchronization precision of the respective apparatuses in the network without changing a physical structure of the frequency source.

It should be noted that, due to an influence of a manufacturing error, the initial frequency of the input signal generated by the frequency source may have a fixed manufacturing error, so as to influence the target frequency of the output signal. Therefore, the factors that influence the crystal oscillator drift may further include the manufacturing error, etc., which will not be limited in the present disclosure.

For example, in some examples, as shown in FIG. 5, the influence parameter of the crystal oscillator drift includes a temperature parameter $T_0$. The parameter acquiring circuit 13 includes a temperature detecting sub-circuit 131. The temperature detecting sub-circuit 131 is configured to detect the temperature parameter $T_0$, to compensate for an error in the target frequency of the output signal caused by the ambient temperature.

For example, the temperature detecting sub-circuit 131 may include a temperature detector and a first counter. The temperature detector is configured to detect the ambient temperature, and the temperature parameter $T_0$ may include the ambient temperature. The first counter is configured to record a frequency change amount based on the ambient temperature and a reference temperature.

For example, a relationship between the temperature parameter and the frequency change amount is nonlinear, but the embodiments of the present disclosure are not limited thereto, and a special temperature sensor may also output a linear proportional relationship between the temperature parameter and the frequency change amount. For example, in the present disclosure, the relationship between the temperature parameter and the frequency change amount may be expressed as:

$$\Delta f = r \cdot \Delta T^n + p \cdot \Delta T^{n-1} + \ldots + d \cdot \Delta T + g$$

where $\Delta f$ denotes the frequency change amount; r, p, d and g are all constants; $\Delta T$ denotes a difference between the ambient temperature and the reference temperature, $\Delta T = T1 - T2$; T1 denotes the ambient temperature; T2 denotes the reference temperature; and n is a positive integer. For example, the reference temperature may be 25° C., i.e., T2=25. However, the embodiments of the present disclosure are not limited thereto, and the reference temperature may also have other value, which will not be limited in the present disclosure.

For example, values of temperature coefficients r, p, d and g may be specifically set according to actual situations. The number of temperature coefficients in the above-described relationship is correlated with n. If the relationship between the temperature parameter and the frequency change amount is a second-order nonlinear relationship, n is 2, and in this case, the relationship between the temperature parameter and the frequency change amount may be expressed as:

$$\Delta f = r \cdot \Delta T^2 + p \cdot \Delta T^1 + g.$$

Thus, only three temperature coefficients, i.e., r, p and g, are included in the above-described relationship. If n adopts other values, the number of temperature coefficients in the above-described relationship will also change accordingly.

For example, the frequency change amount represents a change amount of the target frequency of the output signal generated by the signal adjusting circuit 12, that is to say, the frequency change amount may be expressed as:

$$\Delta f = f_1 - f_2 = r \cdot \Delta T^n + p \cdot \Delta T^{n-1} + \ldots + d \cdot \Delta T + g$$

where $f_1$ denotes the target frequency of the output signal at the current ambient temperature, and $f_2$ denotes the target frequency of the output signal at the reference temperature.

For example, a relationship between the frequency control word and the frequency change amount may be expressed as:

$$F_N = \frac{F_{TO} \cdot f_\Delta + + \Delta f \cdot F_{TO}^2}{f_\Delta} = \qquad (1)$$

$$\frac{F_{TO} \cdot f_\Delta + (r \cdot T\Delta^{n-1} + p \cdot \Delta T^n + \ldots + d \cdot \Delta T + g) \cdot F_{TO}^2}{f_\Delta}$$

where $F_N$ denotes the frequency control word; $F_{TO}$ denotes a reference frequency control word corresponding to the reference temperature (i.e., a frequency control word at the reference temperature); and $f_\Delta$ denotes a frequency of a reference time unit. The reference frequency control word $F_{TO}$ may be pre-detected and stored in a memory of the electronic apparatus. For example, the control circuit may be configured to generate the frequency control word based on the ambient temperature according to the formula (1).

For example, in the signal generating circuit provided by at least one embodiment of the present disclosure, the temperature detector may detect the ambient temperature, and feed back in real time the temperature parameter to the control circuit 11; and the control circuit 11 may adjust the frequency control word in real time based on the temperature parameter, so as to compensate in real time for the frequency error of the target frequency of the output signal caused by the temperature.

For example, in other examples, as shown in FIG. 5, the influence parameter of the crystal oscillator drift includes an aging parameter $A_0$. The parameter acquiring circuit 13 may include an aging read sub-circuit 132. The aging read sub-circuit 132 is configured to read the aging parameter $A_0$ of the crystal oscillator source, to compensate for an error in the target frequency of the output signal caused by aging of the frequency source.

For example, the aging read sub-circuit 132 may include an aging read element and a second counter. The aging read element is configured to read an aging rate of the crystal oscillator source, and to read reference time corresponding to the aging rate of the crystal oscillator source; and the aging parameter includes the aging rate and the reference time. The second counter is configured to record an amount of the reference time.

It should be noted that, the aging rate is determined by the nature of the crystal oscillator source itself, and the aging rate may be considered as a fixed value during the use of the crystal oscillator source. The aging rate may be provided by a manufacturer that produces the crystal oscillator source; the aging rate may be stored in the memory of the electronic apparatus; and when such a parameter as the aging rate is required, it is read by the aging read element directly from the memory of the electronic apparatus.

For example, the aging rate of the crystal oscillator source may be expressed in ppm (parts per million) or ppb (parts per billion). For example, if the aging rate of the crystal oscillator source is ±5 ppm/year, it indicates that an error value of a frequency of a signal generated by the crystal oscillator source within one year is within ±5 ppm; if the aging rate of the crystal oscillator source is ±1 ppm/mouth, it indicates that an error value of a frequency of a signal generated by the crystal oscillator source within one month is within ±1 ppm.

For example, the reference time is related with the aging rate. If the unit time of the aging rate of the crystal oscillator source is a year, for example, the aging rate of the crystal oscillator source is ±5 ppm/year, then the reference time is one year; and if the unit time of the aging rate of the crystal oscillator source is a month, for example, the aging rate of the crystal oscillator source is ±1 ppm/month, then the reference time is one month.

For example, a relationship between the frequency control word and the aging parameter may be expressed as:

$$F_N = F_{AO} \cdot (1+\gamma) \quad (2)$$

where $F_N$ denotes the frequency control word; $F_{AO}$ denotes the reference frequency control word; $\gamma$ denotes a product of the aging parameter, where $\gamma = v \cdot t$, $v$ denotes the aging rate, t denotes the amount of the reference time, and t is a natural number, i.e., 0, 1, 2 . . . . The reference frequency control word $F_{AO}$ may denote a frequency control word corresponding to the initial use of the frequency source, and the reference frequency control word $F_{AO}$ may be pre-detected and stored in the memory of the electronic apparatus. For example, the control circuit may be configured to generate the frequency control word based on the aging rate according to the formula (2).

For example, if the unit time of the aging rate is a year, that is, if the reference time is one year, in a case where the frequency source 200 is put into use for less than one year, t is 0; in a case where the frequency source 200 is put into use for more than one year and less than two years, t is 1; so on and so forth.

For example, in the signal generating circuit provided by at least one embodiment of the present disclosure, the aging read sub-circuit 132 may transmit the aging parameter $A_0$ to the control circuit 11 every predetermined time interval, so as to perform aging correction on the frequency control word. The predetermined time may be 10 days, one month, one year, and so on. For example, the predetermined time may be the same as the reference time. For example, if the reference time is one year, the predetermined time may also be one year, that is, the frequency control word is subjected to an aging correction every other year.

It should be noted that, in some embodiments, a parameter acquiring circuit 13 may simultaneously include both a temperature detecting sub-circuit 131 and an aging read sub-circuit 132, to simultaneously compensate for influences of an ambient temperature and frequency source aging on an output signal.

For example, as shown in FIG. 5, the control circuit 11 may include a calculating sub-circuit 111 and an output sub-circuit 112. The calculating sub-circuit 111 is configured to acquire the influence parameter of the crystal oscillator drift from the parameter acquiring circuit 13 (for example, the influence parameter includes the aging parameter $A_0$ and the temperature parameter $T_0$, etc.), and to generate the frequency control word F based on the influence parameter of the crystal oscillator drift. The output sub-circuit 112 is configured to output the frequency control word F to the signal adjusting circuit 12.

For example, the calculating sub-circuit 111 may calculate the frequency control word according to the above-described formula (1) and/or formula (2).

For example, the output sub-circuit 112 may output the frequency control word F calculated by the calculating sub-circuit 111 to the signal adjusting circuit 12 under the control of the clock signal.

For example, the control circuit 11 may be implemented by a hardware circuit. For example, the calculating sub-circuit 111 and the output sub-circuit 112 may be implemented by hardware circuits. The calculating sub-circuit 111 may be constituted by elements such as transistors, resistors, capacitors and amplifiers. The output sub-circuit 112 may be constituted by elements such as a trigger. Of course, a function of the control circuit 11 may also be implemented by software. For example, functions of the calculating sub-circuit 111 and the output sub-circuit 112 may also be implemented in software. For example, instructions and data stored in the memory may be executed by a processor so as to implement the functions of the calculating sub-circuit 111 and the output sub-circuit 112.

For example, as shown in FIG. 5, the signal adjusting circuit 12 may include a reference time unit generating sub-circuit 121 and a frequency adjusting sub-circuit 122. The reference time unit generating sub-circuit 121 is configured to receive the input signal having the initial frequency $f_c$, and generate and output the reference time unit $\Delta$ based on the initial frequency. The frequency adjusting sub-circuit 122 is configured to generate and output the output signal having the target frequency $f_{TAF-DPS}$ based on the frequency control word F and the reference time unit $\Delta$.

Figure 6A:
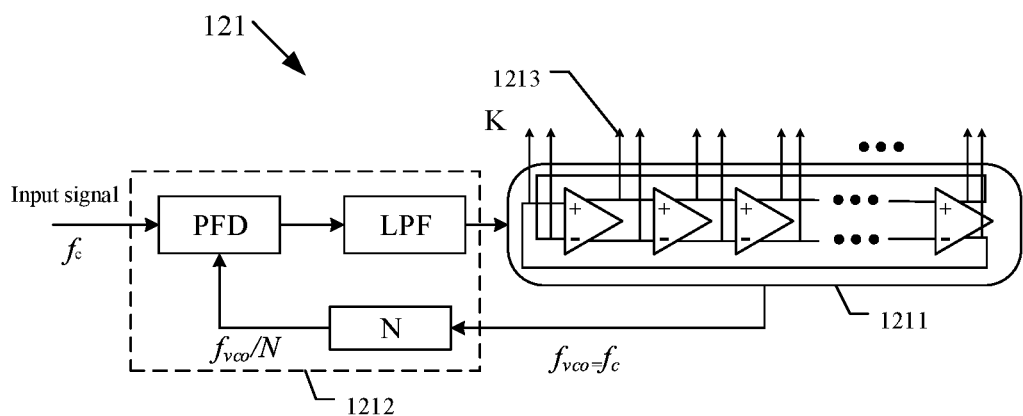
FIG. 6A is a schematic structural diagram of a reference time unit generating sub-circuit provided by at least one embodiment of the present disclosure.
Figure 6B:
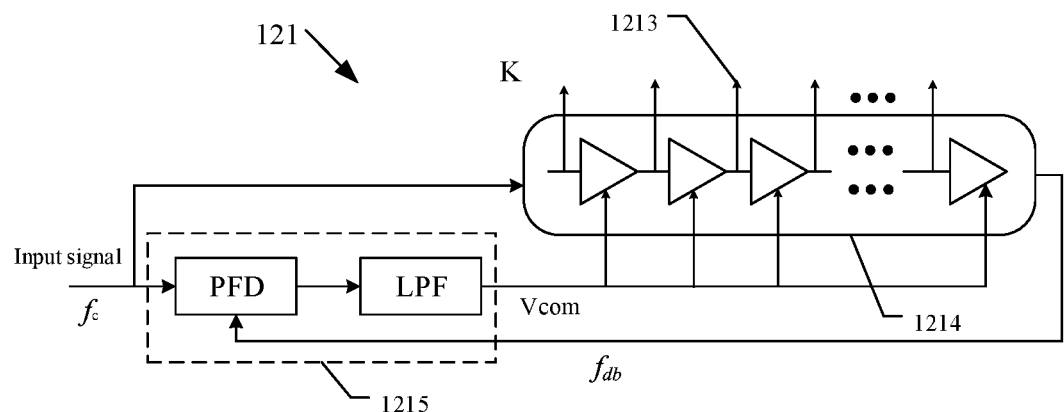
FIG. 6B is a schematic structural diagram of another reference time unit generating sub-circuit provided by at least one embodiment of the present disclosure.
Figure 7:
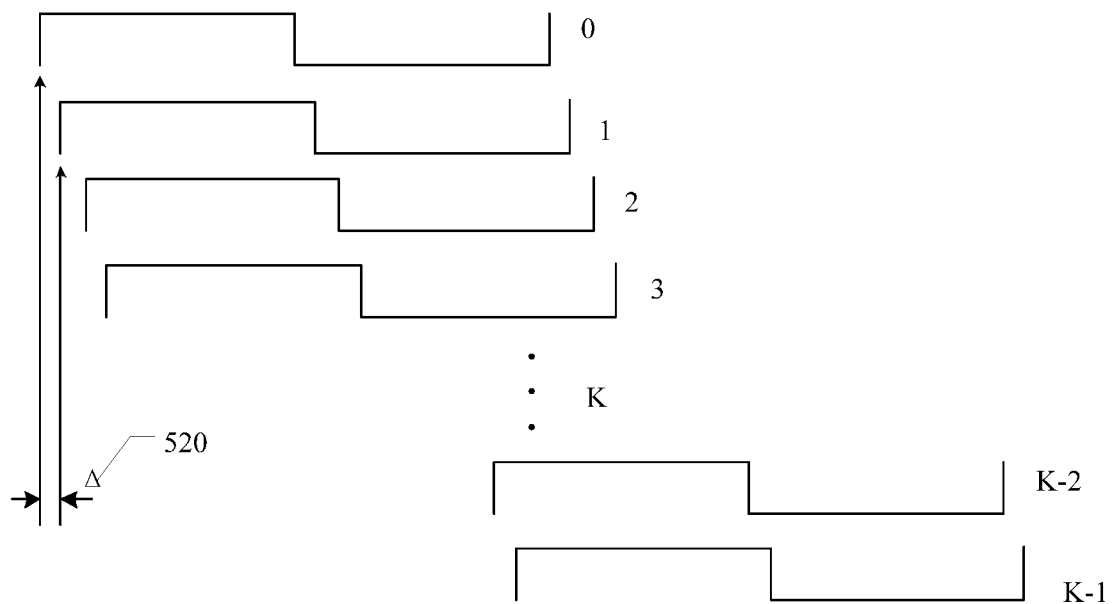
FIG. 7 is a schematic diagram of K reference output signals having phases evenly spaced provided by at least one embodiment of the present disclosure.

FIG. 6A shows a schematic structural diagram of a reference time unit generating sub-circuit provided by at least one embodiment of the present disclosure; FIG. 6B shows a schematic structural diagram of another reference time unit generating sub-circuit provided by at least one embodiment of the present disclosure; and FIG. 7 shows a schematic diagram of K reference output signals having phases evenly spaced provided by at least one embodiment of the present disclosure;

For example, the reference time unit generating sub-circuit 121 is configured to generate and output K reference output signals having phases evenly spaced and the reference time unit based on the initial frequency. The reference time unit generating sub-circuit 121 may include a phase locked loop (PLL) or a delay locked loop (DLL).

For example, in some examples, the reference time unit generating sub-circuit 121 may include the PLL. As shown in FIG. 6A, the reference time unit generating sub-circuit 121 may include a voltage controlled oscillator (VCO) 1211, a first phase locked loop circuit 1212 and K output terminals 1213. The voltage controlled oscillator 1211 is configured to oscillate at a predetermined oscillation frequency; the first phase locked loop circuit 1212 is configured to lock an output frequency of the voltage controlled oscillator 1211 to a reference output frequency; the K output terminals 1213 are configured to output K output signals having phases evenly spaced, K is a positive integer greater than 1, for example, K=16, 32, 128 or other numerical value.

For example, the reference time unit may be denoted as $\Delta$, and the reference output frequency may be denoted as $f_d$. As shown in FIG. 7, the reference time unit $\Delta$ is a time span between any two adjacent output signals output by the K output terminals 1213. The reference time unit $\Delta$ is usually generated by a multi-stage voltage controlled oscillator 1211. A frequency $f_{vco}$ of a signal generated by the voltage controlled oscillator 1211 may be locked by the first phase locked loop circuit 1212 to a known reference output frequency $f_d$, i.e., $f_d=f_{vco}$.

For example, the reference time unit Δ may be calculated by using a formula below:

$$\Delta = T_d/K = 1/(K \cdot f_d) \quad (3)$$

where $T_d$ denotes a period of a signal generated by the multi-stage voltage controlled oscillator 1211. $f_\Delta$ denotes a frequency of the reference time unit, that is, $f_\Delta=1/\Delta=K \cdot f_d$.

For example, the first phase locked loop circuit 1212 includes a phase and frequency detector (PFD), a loop filter (LPF) and a frequency divider (N). For example, in the embodiment of the present disclosure, firstly, the input signal having the initial frequency may be input to the phase and frequency detector, then enter the loop filter, next enter the voltage controlled oscillator, and finally a signal having a predetermined oscillation frequency $f_{vco}$ generated by the voltage controlled oscillator may have its frequency divided by the frequency divider to obtain a frequency division frequency $f_{vco}/N$ of a frequency division signal; the frequency division frequency $f_{vco}/N$ is fed back to the phase and frequency detector, and the phase and frequency detector is configured to compare the initial frequency $f_c$ of the input signal with the frequency division frequency $f_{vco}/N$; when the initial frequency $f_c$ and the frequency division frequency $f_{vco}/N$ are the same in terms of frequency and phase, an error between the two is zero, and in this case, the PLL is in a locked state.

It should be noted that, the loop filter may be a low pass filter. A frequency division coefficient of the frequency divider is N, N is a real number, and N is greater than or equal to 1.

For example, the reference output frequency $f_d$ is related with the initial frequency $f_c$. For example, a relationship between the frequency $f_{vco}$ of the signal generated by the voltage controlled oscillator 1211 and the initial frequency $f_c$ may be expressed as: $f_{vco}=N \times f_c$; since $f_d=f_{vco}$, the reference time unit Δ may be expressed as: $\Delta=T_d/K=1/(K \cdot f_d)=1/(K \cdot N \cdot f_c)$. If the frequency division coefficient N is 1, $f_{vco}=f_c$; and meanwhile, since $f_d=f_{vco}$, the reference output frequency $f_d$ may be equal to the initial frequency $f_c$, that is to say, $f_d=f_c$.

For example, in other examples, the reference time unit generating sub-circuit 121 may include the DLL. The DLL may be implemented by using a CMOS technology, so that the DLL may be easily integrated into any chip and circuit, which reduces costs of the signal generating circuit and improves efficiency. For example, as shown in FIG. 6B, the reference time unit generating sub-circuit 121 includes a voltage controlled delayer 1214, a second phase locked loop circuit 1215 and K output terminals 1213. The voltage controlled delayer 1214 may include one or more cascaded delay units, and is configured to generate a delay signal based on the input signal and the output signal of the second phase locked loop circuit 1215; the second phase locked loop circuit 1215 is configured to lock an output frequency of the voltage controlled delayer 1214 to the reference output frequency based on the input signal and the delay signal; and the K output terminals 1213 are configured to output K output signals having phases evenly spaced, K is a positive integer greater than 1.

For example, as shown in FIG. 6B, the second phase locked loop circuit 1215 may include a phase and frequency detector (PFD), a charge pump (not shown) and a loop filter (LPF), etc. The phase and frequency detector is configured to detect a phase difference between the initial frequency $f_c$ of the input signal and a frequency $f_{db}$ of the delay signal which is fed back, and output the phase difference to the charge pump; the charge pump is configured to output a voltage signal proportional to the phase difference based on the phase difference, and output the voltage signal to the loop filter; and the loop filter is configured to filter out higher harmonics of the voltage signal, so as to obtain a control voltage Vcom for controlling the voltage controlled delayer 1214.

For example, the delay unit may include a 2-to-1 multiplexing gate circuit (MUX2_1) or the like. Delay time of the delay unit may vary with the control voltage Vcom; for example, the control voltage of the delay unit is Vcom, the delay time is Tvcol, and Vcom is proportional to Tvcol.

For example, the reference output frequency is denoted as $f_d$, and the reference time unit is denoted as Δ. The reference time unit Δ is a time span between any two adjacent output signals output by the K output terminals, $\Delta=1/(K \cdot f_d)$. The reference output frequency $f_d$ is equal to the initial frequency $f_c$, so that $\Delta=1/(K \cdot f_c)$.

For example, the initial frequency of the input signal generated by the frequency source 200 is $f_c$, and if the reference output frequency $f_d$ is equal to the initial frequency $f_c$, that is, $f_d=f_c$, then, time granularity of the input signal is $1/f_d$; after the initial frequency $f_c$ of the input signal output by the frequency source is adjusted by the signal generating circuit 100, the output signal having the target frequency $f_{TAF-DPS}$ may be obtained; and the time granularity of the output signal is Δ, i.e., $1/(K \cdot f_d)$, K is a positive integer greater than 1. The time granularity $1/(K \cdot f_d)$ of the output signal is smaller than the time granularity $1/f_d$ of the input signal, so that the electronic apparatus comprising the signal generating circuit has higher time synchronization precision and better operation coordination. For example, in an example, the initial frequency of the input signal generated by the frequency source 200 is $f_c=20$ MHz, and thus the time granularity of the input signal is 50 ns, and the frequency granularity is $5 \times 10^{-8}$. After the signal generating circuit processes the input signal to obtain the output signal, the time granularity of the output signal is Δ, and the frequency granularity is $1/(K \cdot f_c)$. Δ may be very small, for example, if K is 1024, A may be 48.8 ps, and thus, the time granularity of the output signal is 48.8 ps, the frequency granularity of the output signal is $4.9 \times 10^{-11}$. Therefore as compared with the input signal, the output signal has the time granularity and the frequency granularity both increased by K (i.e., 1024) times.

Correspondence between the time granularity and the frequency granularity of the input signal and the output signal may be as shown in Table 1 below.

TABLE 1

| | Input signal | | Output signal | | | |
|---|---|---|---|---|---|---|
| | | | K = 128 | | K = 1024 | |
| $f_c$ | Time granularity | Frequency granularity | Time granularity | Frequency granularity | Time granularity | Frequency granularity |
| 1 MHz | 1 us | $10^{-6}$ | 7.8 ns | $7.8 \times 10^{-9}$ | 977 ps | $9.8 \times 10^{-10}$ |
| 10 MHz | 100 ns | $10^{-7}$ | 781 ps | $7.8 \times 10^{-10}$ | 97.7 ps | $9.8 \times 10^{-11}$ |
| 20 MHz | 50 ns | $5 \times 10^{-8}$ | 390 ps | $3.9 \times 10^{-10}$ | 48.8 ps | $4.9 \times 10^{-11}$ |

It can be known from the above Table 1 that, after the signal generating circuit according to the present disclosure adjusts the input signal, the output signal can be obtained; since the target frequency of the output signal is larger than the initial frequency of the input signal, the time granularity and the frequency granularity of the output signal are both improved.

It should be noted that, the circuit structures shown in FIG. 6A and FIG. 6B are only exemplary implementations of the reference time unit generating sub-circuit 121. The structure of the reference time unit generating sub-circuit 121 is not limited thereto, or it may also be constructed by other circuit structures, which will not be limited here in the present disclosure.

Figure 8:
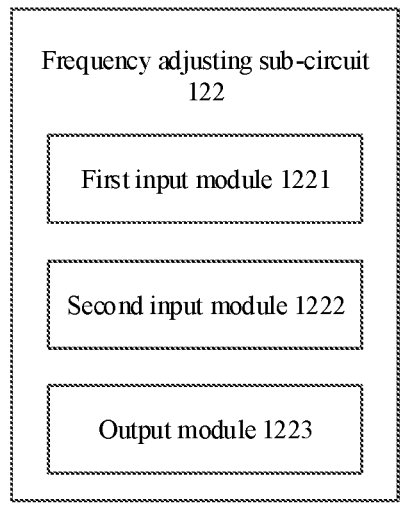
FIG. 8 is a schematic block diagram of a frequency adjusting sub-circuit provided by at least one embodiment of the present disclosure.
Figure 9:
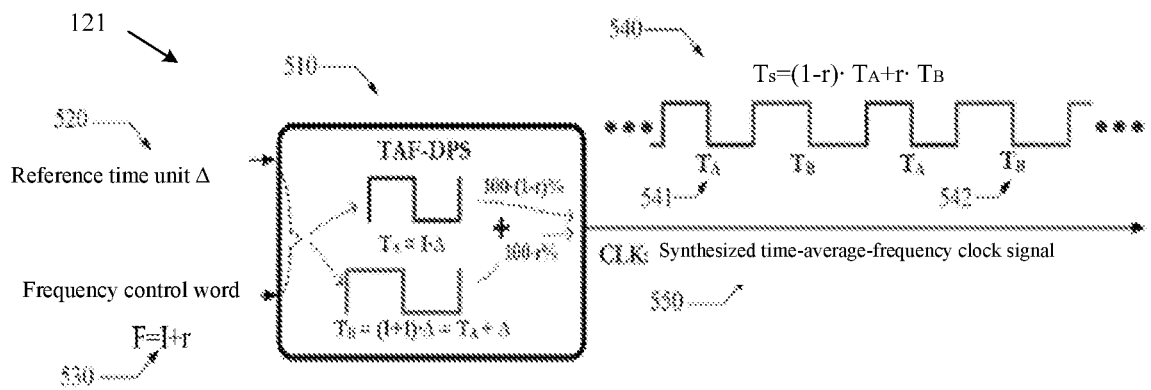
FIG. 9 is a schematic diagram of a working principle of a frequency adjusting sub-circuit provided by at least one embodiment of the present disclosure.

FIG. 8 shows a schematic block diagram of a frequency adjusting sub-circuit provided by at least one embodiment of the present disclosure; and FIG. 9 is a schematic diagram of a working principle of a frequency adjusting sub-circuit provided by at least one embodiment of the present disclosure.

For example, as shown in FIG. 8, the frequency adjusting sub-circuit 122 includes a first input module 1221, a second input module 1222 and an output module 1223. The first input module 1221 is configured to receive K reference output signals having phases evenly spaced and the reference time unit from the reference time unit generating sub-circuit 121. The second input module 1222 is configured to receive the frequency control word from the control circuit 11. The output module 1223 is configured to generate and output an output signal having a target frequency that matches the frequency control word and the reference time unit.

For example, the frequency adjusting sub-circuit 122 may include a time-average-frequency direct period synthesizer (TAF-DPS). The time-average-frequency direct period synthesis (TAF-DPS) technology is an emerging frequency synthesis technology that can generate a pulse signal of any frequency. That is to say, the TAF-DPS can implement fine frequency adjustment of small frequency granularity. Furthermore, since each individual pulse is constructed directly, an output frequency of the TAF-DPS may be changed instantaneously, that is, with rapidity of frequency switching. Experiments have shown that, the frequency granularity of the TAF-DPS can reach several ppb (parts per billion). Generation of any frequency and fast frequency switching are major advantages of the TAF-DPS over a conventional frequency source. The TAF-DPS may be a specific implementation of the frequency adjusting sub-circuit 122 according to the embodiment of the present disclosure.

Thus, advantages of the signal generating circuit provided by the embodiment of the present disclosure include, but are not limited to:

(1) Low costs and flexibility of implementation. A TAF-DPS-based frequency compensator may be fully digitally designed and burned into a programmable logic device (e.g., a FPGA) by HDL encoding, and a parameter of the frequency compensator may also be conveniently reset at any time. Therefore, functions of the frequency compensator may be implemented by a general FPGA or other programmable device without a special dedicated circuit. Of course, an ASIC may also be employed to implement the functions of the frequency compensator.

(2) High precision. A frequency/period of a pulse signal output by the TAF-DPS may be precisely controlled, and its frequency resolution can reach the parts per billion level, so that time synchronization precision can be effectively improved.

For example, the TAF-DPS may be implemented by a programmable logic device (e.g., an ASIC or an FPGA). Alternatively, the TAF-DPS may be implemented by a conventional analog circuit device. The present disclosure has no limitation in this aspect.

Hereinafter, a working principle of the frequency adjusting sub-circuit based on the TAF-DPS will be described with reference to FIG. 9.

For example, as shown in FIG. 9, a frequency adjusting sub-circuit 122 based on a TAF-DPS 510 has two inputs: a reference time unit 520 and a frequency control word 530. The frequency control word 530 is denoted as F, F=I+r, where I is an integer greater than 1, and r is a fraction.

For example, the TAF-DPS 510 has an output CLK 550. The CLK 550 is a synthesized time-average-frequency clock signal. In at least one embodiment of the present disclosure, the CLK 550 is just the output signal having the target frequency. According to the reference time unit 520, the TAF-DPS 510 may generate two types of periods, namely, a first period $T_A = I \cdot \Delta$ and a second period $T_B = (I+1) \cdot \Delta$. The output CLK 550 is a clock pulse train 540, and the clock pulse train 540 is constituted by the first period $T_A$ 541 and the second period $T_B$ 542 in an interleaved manner. The fraction r is used to control a probability of occurrence of the second period $T_B$, and therefore, r can also determine a probability of occurrence of the first period $T_A$.

For example, as shown in FIG. 9, a period $T_{TAF\text{-}DPS}$ of the output signal CLK 550 may be expressed by a formula bellow:

$$T_{TAF\text{-}DPS} = (1-r) \cdot T_A + r \cdot T_B = T_A + r \cdot (T_B - T_A) = T_A + r \cdot \Delta = I \cdot \Delta + r \cdot \Delta = (I+r) \cdot \Delta.$$

Therefore, if the frequency control word 530 is F=I+r, a formula below may be derived:

$$T_{TAF\text{-}DPS} = F \cdot \Delta \quad (4)$$

It may be known from the above formula (4) that, the period $T_{TAF\text{-}DPS}$ of the output signal CLK output by the TAF-DPS 510 is linearly proportional to the frequency control word 530. If the frequency control word 530 changes, the period $T_{TAF\text{-}DPS}$ of the output signal output by the TAF-DPS 510 will also change in the same manner.

Furthermore, since the period T is inversely proportional to the frequency f, if a predetermined condition is satisfied, for example, if a change amount of the frequency control word 530 is very small (less than a predetermined threshold), the target frequency of the output signal may also follow a waveform change of the frequency control word (F) in an approximately linear manner. The control circuit 11 may generate the frequency control word based on the influence parameter of the crystal oscillator drift, then the TAF-DPS 510 generates the output signal having the target frequency based on the frequency control word. The target frequency corresponds to the frequency control word, the target frequency may be adjusted by adjusting the frequency control word; and after the frequency control word is compensated based on the temperature parameter and the aging parameter, the target frequency is also compensated for accordingly.

For example, based on the above-described formula (3) and formula (4), the target frequency is expressed as:

$$f_{TAF\text{-}DPS}=1/T_{TAF\text{-}DPS}=1/(F\cdot\Delta)=(K\cdot f_d)/F$$

where $f_{TAF\text{-}DPS}$ denotes the target frequency, and F denotes the frequency control word. For example, the frequency adjusting sub-circuit may be configured to determine the target frequency based on the frequency control word and the reference time unit according to this formula.

Figure 10A:
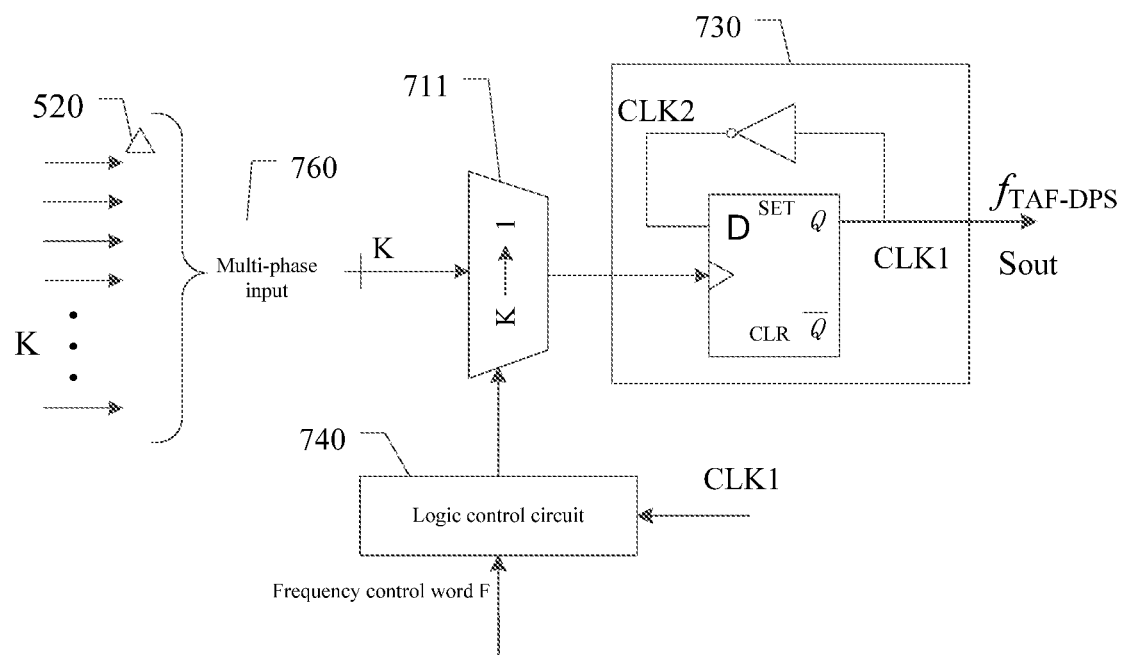
FIG. 10A is a schematic structural diagram of a frequency adjusting sub-circuit provided by at least one embodiment of the present disclosure.
Figure 10B:
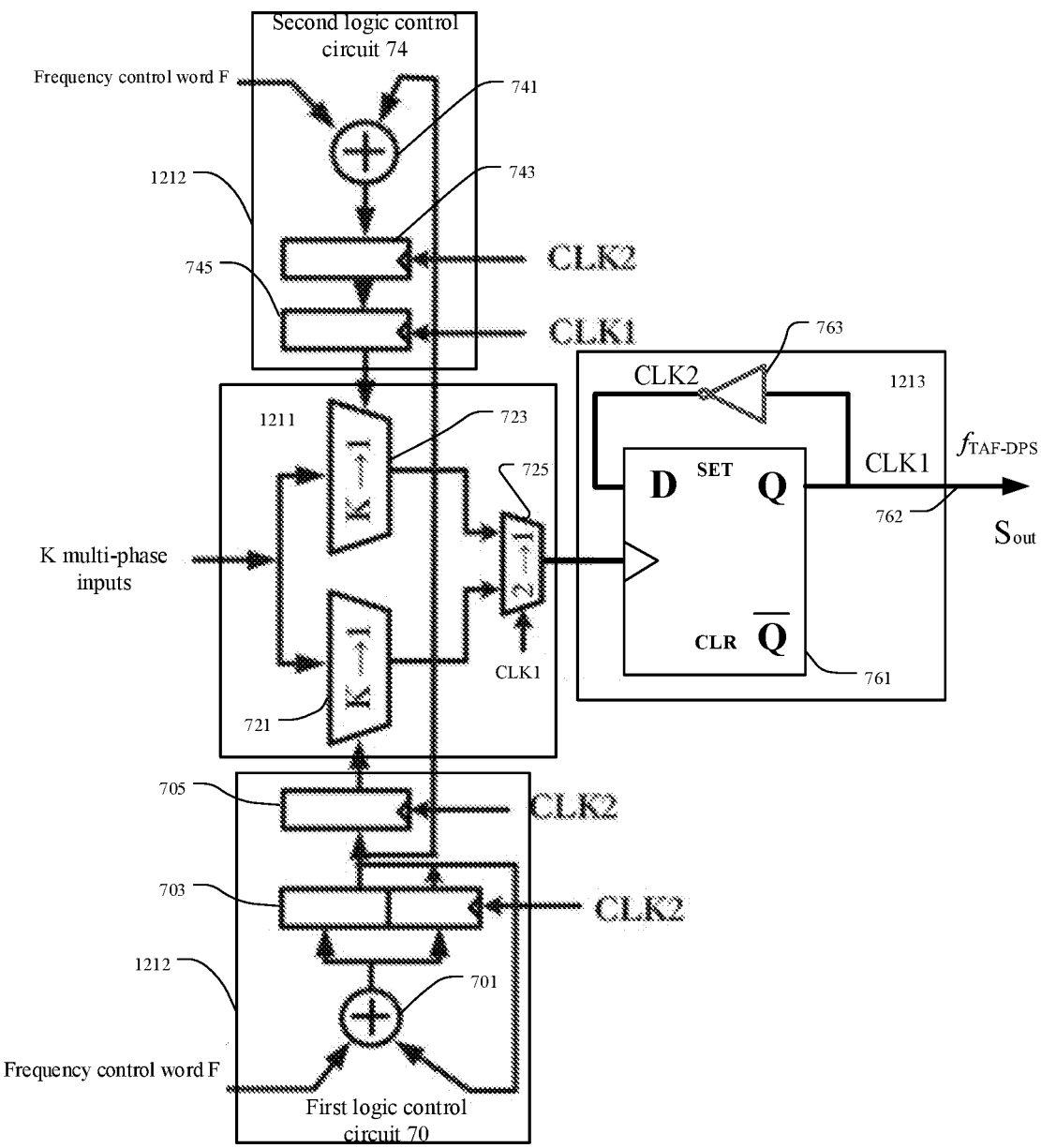
FIG. 10B is a schematic structural diagram of another frequency adjusting sub-circuit provided by at least one embodiment of the present disclosure.

FIG. 10A is a schematic structural diagram of a frequency adjusting sub-circuit provided by at least one embodiment of the present disclosure; and FIG. 10B is a schematic structural diagram of another frequency adjusting sub-circuit provided by at least one embodiment of the present disclosure.

Hereinafter, a circuit structure of the TAF-DPS will be described with reference to FIG. 10A and FIG. 10B.

For example, as shown in FIG. 10A, in some embodiments, a first input module 1221 includes a K→1 multiplexer 711. The K→1 multiplexer 711 has a plurality of input terminals for receiving K reference output signals having phases evenly spaced, a control input terminal and an output terminal.

For example, an output module 1223 includes a trigger circuit 730. The trigger circuit 730 is configured to generate a pulse train. The pulse train is constituted, for example, by a pulse signal of a first period $T_A$ and a pulse signal of a second period $T_B$ in an interleaved manner. The trigger circuit 730 includes a D trigger, an inverter and an output terminal. The D trigger includes a data input terminal, a clock input terminal for receiving an output from the output terminal of the K→1 multiplexer 711, and an output terminal for outputting a first clock signal CLK1. The inverter includes an inverter input terminal for receiving the first clock signal CLK1 and an inverter output terminal for outputting a second clock signal CLK2. The output terminal of the trigger circuit 730 is configured to output the first clock signal CLK1 as an output signal $S_{out}$ having a target frequency.

For example, the first clock signal CLK1 includes a pulse train. The second clock signal CLK2 is coupled to the data input terminal of the D trigger.

For example, a second input module 1222 includes a logic control circuit 740. The logic control circuit 740 includes an input terminal for receiving a frequency control word F output by a control circuit 11, a clock input terminal for receiving the first clock signal CLK1, and an output terminal coupled to the control input terminal of the K→1 multiplexer of the first input module 1221.

For example, as shown in FIG. 10B, in other embodiments, a first input module 1221 includes a first K→1 multiplexer 721, a second K→1 multiplexer 723, and a 2→1 multiplexer 725. The first K→1 multiplexer 721 and the second K→1 multiplexer 723 respectively include a plurality of input terminals for receiving K signals having phases evenly spaced, a control input terminal and an output terminal. The 2→1 multiplexer 725 includes a control input terminal, an output terminal, a first input terminal for receiving an output of the first K→1 multiplexer 721, and a second input terminal for receiving an output of the second K→1 multiplexer 723.

For example, as shown in FIG. 10B, an output module 1223 includes a trigger circuit. The trigger circuit is configured to generate a pulse train. The trigger circuit includes a D trigger 761, an inverter 763 and an output terminal 762. The D trigger 761 includes a data input terminal, a clock input terminal for receiving an output from the output terminal of the 2→1 multiplexer 725, and an output terminal for outputting a first clock signal CLK1. The inverter 763 includes an input terminal for receiving the first clock signal CLK1 and an output terminal for outputting a second clock signal CLK2. The output terminal 762 of the trigger circuit is configured to output the first clock signal CLK1 as an output signal $S_{out}$ having a target frequency.

For example, the first clock signal CLK1 is coupled to the control input terminal of the 2→1 multiplexer 725, and the second clock signal CLK2 is coupled to the data input terminal of the D trigger 761.

For example, as shown in FIG. 10B, a second input module 1222 includes a first logic control circuit 70 and a second logic control circuit 74. The first logic control circuit 70 includes a first adder 701, a first register 703 and a second register 705. The second logic control circuit 74 includes a second adder 741, a third register 743 and a fourth register 745.

The first adder 701 adds a frequency control word (F) and most significant bits (for example, 5 bits) stored in the first register 703, and then saves the addition result to the first register 703 at a rising edge of the second clock signal CLK2; or, the first adder 701 adds the frequency control word (F) and all information stored in the first register 703, and then saves the addition result to the first register 703 at a rising edge of the second clock signal CLK2. At a rising edge of a next second clock signal CLK2, the most significant bits stored in the first register 703 will be stored in the second register 705 and used as a selection signal of the first K→1 multiplexer 721 to select one signal from K multi-phase input signals as a first output signal of the first K→1 multiplexer 721.

The second adder 741 adds the frequency control word (F) and the most significant bits stored in the first register 703, and then saves the addition result to the third register 743 at a rising edge of the second clock signal CLK2. At a rising edge of a next first clock signal CLK1, information stored in the third register 743 will be stored in the fourth register 745 and used as a selection signal of the second K→1 multiplexer 723 to select one signal from the K multi-phase input signals as a second output signal of the second K→1 multiplexer 723.

The 2→1 multiplexer 725, at a rising edge of the first clock signal CLK1, selects one of the first output signal from the first K→1 multiplexer 721 and the second output signal from the second K→1 multiplexer 723 as an output signal of the 2→1 multiplexer 725, to serve as an input clock signal of the D trigger 761.

For example, a period ($T_{TAF-DPS}$) of the output signal $S_{out}$ output by the TAF-DPS shown in FIG. 10A and FIG. 10B may be calculated by using the above formula (4). For example, the frequency control word is set in a form of F=I+r, where I is an integer within a range of [2, 2K], and r is a fraction within a range of [0, 1).

In addition, for a working principle of the TAF-DPS, please refer to documents L. XIU, "Nanometer Frequency Synthesis beyond the Phase-Locked Loop", Piscataway, N.J. 08854, USA, John Wiley IEEE-press, 2012 and L. XIU, "From Frequency to Time-Average-Frequency: a Paradigm Shift in the Design of Electronic System", Piscataway, N.J. 08854, USA, John Wiley IEEE-press, 2015, the disclosure of which are hereby incorporated entirely by reference herein.

Figure 11:
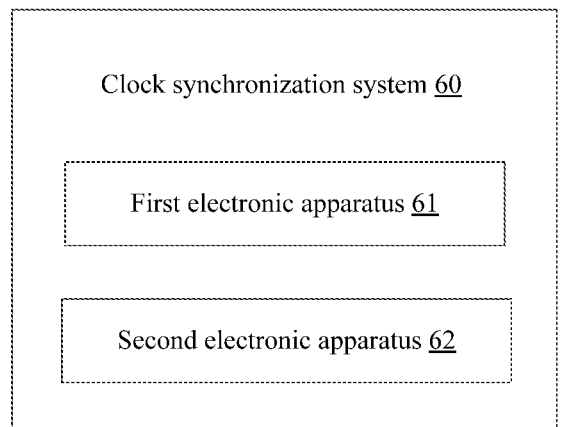
FIG. 11 is a schematic block diagram of a time synchronization system provided by at least one embodiment of the present disclosure.
Figure 12:
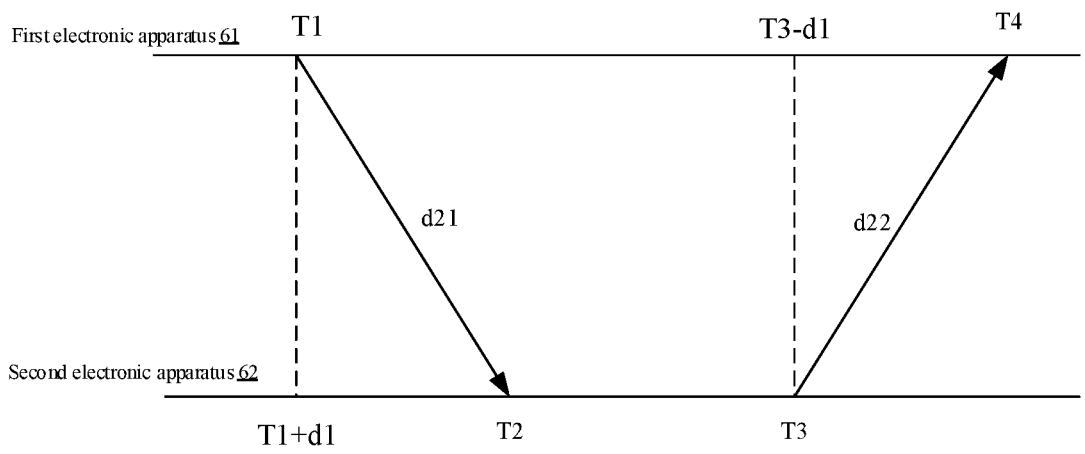
FIG. 12 is a schematic diagram of time synchronization based on a network time protocol NTP in a time synchronization system provided by at least one embodiment of the present disclosure.

FIG. 11 shows a schematic block diagram of a time synchronization system provided by at least one embodiment of the present disclosure; and FIG. 12 shows a schematic diagram of time synchronization based on a network time protocol NTP in a time synchronization system provided by at least one embodiment of the present disclosure.

For example, a time synchronization system 60 provided by at least one embodiment of the present disclosure may comprise a plurality of electronic apparatuses. At least one of the plurality of electronic apparatuses is any one of the above-mentioned electronic apparatuses. A signal generating circuit of the electronic apparatus may generate an output signal having a target frequency; a time adjusting circuit of the electronic apparatus may perform a synchronization adjusting operation on a clock signal of the electronic apparatus based on the output signal having the target frequency, so that network time synchronization precision of the electronic apparatus is higher For example, each electronic apparatus in the time synchronization system 60 may be the electronic apparatus according to any one of the above-described embodiments, so that each electronic apparatus in the time synchronization system 60 can adjust its clock signal based on the output signal having the target frequency, so that the plurality of electronic apparatuses in the time synchronization system 60 are synchronized. Since the target frequency of the output signal is higher than an initial frequency of an input signal output by an original frequency source, time synchronization precision of the plurality of electronic apparatuses in the time synchronization system 60 is high, which renders consistency and operation coordination of individual electronic apparatuses better.

For example, as shown in FIG. 11, in some examples, the time synchronization system 60 comprises two electronic apparatuses, which are a first electronic apparatus 61 and a second electronic apparatus 62. The first electronic apparatus 61 may be located at a client and the second electronic apparatus 62 may be located at a server. As shown in FIG. 12, the first electronic apparatus 61 is configured to send a first network message to the second electronic apparatus 62 at a first timestamp. The first network message is attached with time information of the first electronic apparatus 61 at the first timestamp. At the first timestamp, time on the first electronic apparatus 61 is T1, so that the first network message includes the time T1; and time on the second electronic apparatus 62 is T1+d1, where d1 is a synchronization time error between the first electronic apparatus 61 and the second electronic apparatus 62; due to a position difference between the first electronic apparatus 61 and the second electronic apparatus 62, the second electronic apparatus 62 receives the first network message at a second timestamp. At the second timestamp, time on the second electronic apparatus 62 is T2, at which time, time on the first electronic apparatus 61 is T2−d1. After a time delay of an internal system of the second electronic apparatus 62, the second electronic apparatus 62 outputs a second network message to the first electronic apparatus 61 at a third timestamp. The second network message is attached with time information of the second electronic apparatus 62 at the second timestamp, a time signal of the second electronic apparatus 62 at the third timestamp, and time information of the first electronic apparatus 61 at the first timestamp that is included in the first network message. At the third timestamp, time on the second electronic apparatus 62 is T3, and time on the first electronic apparatus 61 is T3−d1. Thus, the second network message includes the time T1, the time T2 and the time T3. The first electronic apparatus 61 receives the second network message at a fourth timestamp. At the fourth timestamp, time on the first electronic apparatus 61 is T4, and time on the second electronic apparatus 62 is T4+d1. Then, the first electronic apparatus 61 can calculate time deviation between the first electronic apparatus 61 and the second electronic apparatus 62 based on the times T1, T2, T3 and T4, to adjust a clock signal of the first electronic apparatus 61, thereby obtaining a synchronous clock signal of the first electronic apparatus 61. The synchronous clock signal of the first electronic apparatus 61 represents its clock signal synchronized with the second electronic apparatus 62, i.e., the synchronous clock signal is synchronized with a clock signal of the second electronic apparatus 62.

For example, precision of the synchronous clock signal of the first electronic apparatus 61 is positively correlated with a value of the target frequency of the output signal output by the signal generating circuit of the first electronic apparatus 61; the higher the target frequency, the higher the precision of the synchronous clock signal of the first electronic apparatus 61. For example, if the target frequency is 100 Hz, time granularity (i.e., synchronization precision) of the synchronous clock signal of the first electronic apparatus 61 may be 0.01 s.

For example, d2 may denote one-way average delay time consumed by transmitting the network message between the first electronic apparatus 61 and the second electronic apparatus 62, and d2 may be expressed as:

$$d2 = \frac{(T4-T1)-(T3-T2)}{2}$$

For example, as shown in FIG. 12, d21 (hereinafter referred to as first transmission delay time) may denote transmission delay time in a process of transmitting the first network message from the first electronic apparatus 61 to the second electronic apparatus 62, and d22 (hereinafter referred to as second transmission delay time) may denote transmission delay time in a process of transmitting the second network message from the second electronic apparatus 62 to the first electronic apparatus 61, then $d21+d22=2 \cdot d2$ The synchronization time error d1 may be expressed as:

$$d1 = \frac{(T2-T1-d21)+(T3-T4+d22)}{2}$$

In a case where the first transmission delay time d21 and the second transmission delay time d22 are equal to each other, that is, d21=d22=d2, the synchronization time error d1 may be expressed as:

$$d1 = \frac{(T2-T1-d2)+(T3-T4+d2)}{2} = \frac{(T2-T1)+(T3-T4)}{2}$$

That is to say, time difference between the first electronic apparatus 61 and the second electronic apparatus 62 is [(T2−T1)+(T3−T4)]/2. For example, in an example, if the time T1 is 10:00:00, the time T2 is 11:00:01, the time T3 is 11:00:02, and the time T4 is 10:00:03, time for one-way transmission of the network message is d2=(3−1)/2=1 second, that is, one-way transmission delay is 1 second; and the synchronization time error d1=(1:00:01+00:59:59)/2=1 hour, that is, a time error required to be corrected is 1 hour.

It should be noted that, the first transmission delay time d21 and the second transmission delay time d22 may also be different from each other, that is, d21 and d22 are not equal to each other. The network time protocol NTP may include a client/server mode, a peer mode, a broadcast mode and a multicast mode, etc.; and in different operation modes, time synchronization modes of the electronic apparatus are different, which will not be limited in the present disclosure. For example, in the above-described example, the time T3 is 11:00:02, and if it is necessary to force the time of the first electronic apparatus 61 to be updated to the time of the second electronic apparatus 62, the time T4 of the first electronic apparatus 61 may be directly updated to T3+d2(1 s), that is to say, at the fourth timestamp, the clock signal of the first electronic apparatus 61 is 11:00:03, and the clock signal of the second electronic apparatus 62 is 11:00:03, that is to say, the clock signal of the first electronic apparatus 61 is synchronized with the clock signal of the second electronic apparatus 62.

For example, the first electronic apparatus 61 needs to adjust its clock signal to be synchronized with the second electronic apparatus 62. The time error that the first electronic apparatus 61 needs to adjust is d1=[(T2−T1)+(T3−T4)]/2. Thus, when the target frequency $f_{TAF-DPS}$ of the output signal generated by the signal generating circuit in the first electronic apparatus 61 satisfies a relationship: d1>1/$f_{TAF-DPS}$, the first electronic apparatus 61 may better correct the time error, so that the first electronic apparatus 61 may be better synchronized with the second electronic apparatus 62.

For example, in an example, in a case where d1 is 0.07 s, if the target frequency $f_{TAF-DPS}$ of the output signal generated by the signal generating circuit in the first electronic apparatus 61 is 100 Hz, time granularity of the output signal of the first electronic apparatus 61 is 0.01 s; and since d1>1/$f_{TAF-DPS}$, the first electronic apparatus 61 can correct the time error between the first electronic apparatus 61 and the second electronic apparatus 62, and the corrected time is 0.07 s, so that the first electronic apparatus 61 is completely synchronized with the second electronic apparatus 62; and if the target frequency $f_{TAF-DPS}$ is 200 Hz, although d1>1/$f_{TAF-DPS}$, the time granularity of the output signal of the first electronic apparatus 61 is 0.02 s, the first electronic apparatus 61 cannot completely correct the time error between the first electronic apparatus 61 and the second electronic apparatus 62, and time that the first electronic apparatus 61 can correct is 0.06 s, thus, a time error after correction between the first electronic apparatus 61 and the second electronic apparatus 62 is 0.01 s. If a time error threshold between the first electronic apparatus 61 and the second electronic apparatus 62 is 0.02 s, and the corrected time error is smaller than the time error threshold, then the corrected clock signal of the first electronic apparatus 61 satisfies a time synchronization requirement of the time synchronization system.

Figure 13:
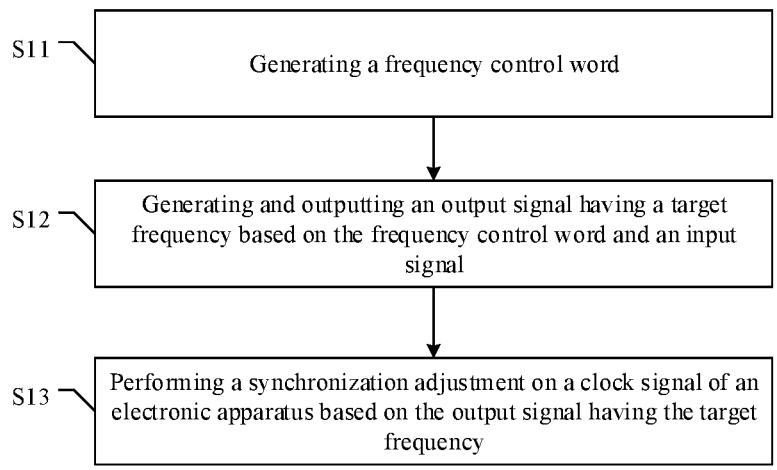
FIG. 13 is a schematic flow chart of a time synchronization method provided by at least one embodiment of the present disclosure.

FIG. 13 shows a schematic flow chart of a time synchronization method provided by at least one embodiment of the present disclosure. The time synchronization method provided by at least one embodiment of the present disclosure may be applied to the time synchronization device according to any one of the embodiments of the present disclosure.

For example, as shown in FIG. 13, the time synchronization method may comprise following steps:

S11: generating a frequency control word;

S12: generating and outputting an output signal having a target frequency based on the frequency control word and an input signal;

S13: performing a synchronization adjustment on a clock signal of an electronic apparatus based on the output signal having the target frequency.

In the time synchronization method provided by the embodiment of the present disclosure, an output signal with a sufficiently large frequency can be synthesized, that is, the output signal has relatively high frequency granularity, so that individual electronic apparatuses obtain a more precise synchronous clock, which renders operation coordination and consistency of the respective electronic apparatuses in the network system better.

For example, step S11 may include: detecting, by a parameter acquiring circuit, an influence parameter of crystal oscillator drift; generating the frequency control word based on the influence parameter of the crystal oscillator drift; and outputting the frequency control word to a signal adjusting circuit.

For example, step S12 may include: receiving an input signal having an initial frequency, generating and outputting a reference time unit based on the input signal having the initial frequency; and generating and outputting the output signal having the target frequency based on the frequency control word and the reference time unit.

For example, the output signal having the target frequency may be generated by a TAF-DPS.

It should be noted that, step S11 and step S12 may be implemented by the signal generating circuit in the time synchronization device according to any one of the embodiments of the present disclosure; step S13 may be implemented by the time adjusting circuit in the time synchronization device according to any one of the embodiments of the present disclosure; and similar operations or steps will not be repeated here.

For example, in step S13, after the synchronization adjustment is performed on the clock signal of the electronic apparatus, synchronous clock signals of the electronic apparatus and remaining electronic apparatuses in the time synchronization system may be obtained, and precision of the synchronous clock signal is positively correlated with a value of the target frequency of the output signal generated by the electronic apparatus.

For example, in some examples, the time synchronization system may comprise a first electronic apparatus and a second electronic apparatus. The time synchronization method may comprise following steps:

S21: sending, by the first electronic apparatus, a first network message to the second electronic apparatus at a first timestamp, at which, time on the first electronic apparatus is T1, and the first network message includes time T1;

S22: receiving, by the second electronic apparatus, the first network message at a second timestamp, at which, time on the second electronic apparatus is T2;

S23: sending, by the second electronic apparatus, a second network message to the first electronic apparatus at a third timestamp, at which, time on the second electronic apparatus is T3, and the second network message includes the time T1, the time T2 and the time T3;

S24: receiving, by the first electronic apparatus, the second network message at a fourth timestamp, at which, time on the first electronic apparatus is T4.

S25: calculating a synchronization time error of the first electronic apparatus and the second electronic apparatus based on the time T1, the time T2, the time T3 and the time T4; and S26: performing a synchronization adjusting operation on the clock signal of the first electronic apparatus based on the output signal having the target frequency generated by the first electronic apparatus, to eliminate the synchronization time error.

For example, in step S26, if the target frequency of the output signal generated by the first electronic apparatus is f, the synchronization time error between the first electronic apparatus and the second electronic apparatus is ΔT, and ΔT>1/f, the first electronic apparatus can better correct the synchronization time error, so that the first electronic apparatus and the second electronic apparatus are synchronized.

For example, step S26 may include steps S11 to S13.

It should be noted that, the time synchronization method shown in FIG. 13 may be implemented by the time synchronization system as described in any one embodiment of the present disclosure, and similar operations or steps will not be repeated here.

With respect to the present disclosure, the following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiments may be combined with each other to obtain a new embodiment.

The above are only particular embodiments of the present disclosure, but the scope of the embodiment of the present disclosure is not limited thereto, and the scope of the present disclosure should be the scope of the following claims.

What is claimed is:

1. A time synchronization device adapted for an electronic apparatus, the time synchronization device comprising: a signal generating circuit and a time adjusting circuit, wherein the signal generating circuit comprises:

a control circuit, configured to generate a frequency control word; and a signal adjusting circuit, configured to receive the frequency control word and an input signal having an initial frequency, and to generate and output an output signal having a target frequency based on the frequency control word and the input signal, and the time adjusting circuit is configured to perform a synchronization adjusting operation on a clock signal of the electronic apparatus based on the output signal having the target frequency.

2. The time synchronization device according to claim 1, wherein the control circuit is configured to generate the frequency control word based on an influence parameter of crystal oscillator drift.

3. The time synchronization device according to claim 2, wherein the signal generating circuit further comprises a parameter acquiring circuit, and the parameter acquiring circuit is configured to acquire the influence parameter.

4. The time synchronization device according to claim 3, wherein the influence parameter of the crystal oscillator drift comprises a temperature parameter;

the parameter acquiring circuit comprises a temperature detecting sub-circuit; and the temperature detecting sub-circuit is configured to detect the temperature parameter.

5. The time synchronization device according to claim 4, wherein the temperature parameter comprises the ambient temperature;

the temperature detecting sub-circuit comprises a temperature detector and a first counter;

the temperature detector is configured to detect the ambient temperature; and the first counter is configured to record a frequency change amount based on the ambient temperature and a reference temperature.

6. The time synchronization device according to claim 5, wherein the control circuit is configured to generate the frequency control word based on the ambient temperature according to a below equation:

$$F_N = \frac{F_{TO} \cdot f_\Delta + \Delta f \cdot F_{TO}^2}{f_\Delta}$$

where $F_N$ denotes the frequency control word; $F_{TO}$ denotes a reference frequency control word corresponding to the reference temperature; and $f_\Delta$ denotes a frequency of a reference time unit; and $$\Delta f = r \cdot \Delta T^n + p \cdot \Delta T^{n-1} + \ldots + d \cdot \Delta T + g$$

where $\Delta f$ denotes the frequency change amount; r, p, d and g are constants; $\Delta T$ denotes a difference between the ambient temperature and the reference temperature, $\Delta T = T1 - T2$; T1 denotes the ambient temperature; T2 denotes the reference temperature; and n is a positive integer.

7. The time synchronization device according to claim 3, wherein the influence parameter of the crystal oscillator drift comprises an aging parameter;

the parameter acquiring circuit comprises an aging read sub-circuit; and the aging read sub-circuit is configured to read the aging parameter of a crystal oscillator source.

8. The time synchronization device according to claim 7, wherein the aging parameter comprises an aging rate of the crystal oscillator and reference time corresponding to the aging rate of the crystal oscillator;

the aging read sub-circuit comprises an aging read element and a second counter;

the aging read element is configured to read the aging rate of the crystal oscillator source, and to read the reference time; and the second counter is configured to record an amount of the reference time.

9. The time synchronization device according to claim 8, wherein the control circuit is configured to generate the frequency control word based on the aging rate according to a below equation:

$$F_N = F_{AO} \cdot (1+\gamma)$$

where $F_N$ denotes the frequency control word; $F_{AO}$ denotes the reference frequency control word; $\gamma$ denotes a product of the aging parameter, wherein $\gamma = v \cdot t$, v denotes the aging rate, t denotes the amount of the reference time, and t is a natural number.

10. The time synchronization device according to claim 2, wherein the signal adjusting circuit comprises a reference time unit generating sub-circuit and a frequency adjusting sub-circuit;
the reference time unit generating sub-circuit is configured to receive the input signal having the initial frequency, and to generate and output the reference time unit based on the initial frequency; and
the frequency adjusting sub-circuit is configured to generate and output the output signal having the target frequency based on the frequency control word and the reference time unit.

11. The time synchronization device according to claim 1, wherein the signal adjusting circuit comprises a reference time unit generating sub-circuit and a frequency adjusting sub-circuit,
the reference time unit generating sub-circuit is configured to receive the input signal having the initial frequency, and to generate and output the reference time unit based on the initial frequency; and
the frequency adjusting sub-circuit is configured to generate and output the output signal having the target frequency based on the frequency control word and the reference time unit.

12. The time synchronization device according to claim 11, wherein the reference time unit generating sub-circuit comprises:
a voltage controlled oscillator, configured to oscillate at a predetermined oscillation frequency;
a first phase locked loop circuit, configured to lock an output frequency of the voltage controlled oscillator to a reference output frequency; and
K output terminals, configured to output K output signals having phases evenly spaced, K being a positive integer greater than 1,
wherein the reference output frequency is denoted as $f_d$, the reference time unit is a time span between any two adjacent output signals output by the K output terminals, the reference time unit is denoted as $\Delta$, and $\Delta = 1/(K \cdot f_d)$.

13. The time synchronization device according to claim 12, wherein the frequency adjusting sub-circuit is configured to determine the target frequency based on the frequency control word and the reference time unit based on a below equation:

$$f_{TAF\text{-}DPS} = 1/(F \cdot \Delta) = (K \cdot f_d)/F$$

where $f_{TAF\text{-}DPS}$ denotes the target frequency, and F denotes the frequency control word.

14. The time synchronization device according to claim 12, wherein the frequency adjusting sub-circuit comprises a time-average-frequency direct period synthesizer.

15. The time synchronization device according to claim 11, wherein the reference time unit generating sub-circuit comprises: a voltage controlled delayer, a second phase locked loop circuit and K output terminals,
the voltage controlled delayer comprises one or more cascaded delay units, and is configured to generate a delay signal based on the output signal of the second phase locked loop circuit and the input signal;
the second phase locked loop circuit is configured to lock an output frequency of the voltage controlled delayer to the reference output frequency based on the input signal and the delay signal;
the K output terminals are configured to output K output signals having phases evenly spaced, K is a positive integer greater than 1; and
the reference output frequency is denoted as $f_d$, the reference time unit is a time span between any two adjacent output signals output by the K output terminals, the reference time unit is denoted as $\Delta$, and $\Delta = 1/(K \cdot f_d)$.

16. The time synchronization device according to claim 15, wherein the frequency adjusting sub-circuit is configured to determine the target frequency based on the frequency control word and the reference time unit according to a below equation:

$$f_{TAF\text{-}DPS} = 1/(F \cdot \Delta) = (K \cdot f_d)/F$$

where $f_{TAF\text{-}DPS}$ denotes the target frequency, and F denotes the frequency control word.

17. An electronic apparatus, comprising the time synchronization device according to claim 1.

18. The electronic apparatus according to claim 17, further comprising a frequency source,
wherein the frequency source is configured to provide the input signal having the initial frequency.

19. A time synchronization system, comprising: a plurality of electronic apparatuses,
wherein at least one of the plurality of electronic apparatuses is the electronic apparatus according to claim 17.

20. A time synchronization method adapted for a time synchronization device,
wherein the time synchronization device is adapted for an electronic apparatus, and the time synchronization device comprises: a signal generating circuit and a time adjusting circuit, the signal generating circuit comprises:
a control circuit, configured to generate a frequency control word; and
a signal adjusting circuit, configured to receive the frequency control word and an input signal having an initial frequency, and to generate and output an output signal having a target frequency based on the frequency control word and the input signal, and
the time adjusting circuit is configured to perform a synchronization adjusting operation on a clock signal of the electronic apparatus based on the output signal having the target frequency,
the time synchronization method comprises:
generating the frequency control word;
generating and outputting the output signal having the target frequency based on the frequency control word and the input signal; and
performing the synchronization adjusting operation on the clock signal of the electronic apparatus based on the output signal having the target frequency.

* * * * *